US006965852B2

(12) United States Patent
Stuecheli

(10) Patent No.: US 6,965,852 B2
(45) Date of Patent: Nov. 15, 2005

(54) PSEUDO RANDOM TEST PATTERN GENERATION USING MARKOV CHAINS

(75) Inventor: Jeffrey Adam Stuecheli, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 1032 days.

(21) Appl. No.: 09/737,347

(22) Filed: Dec. 15, 2000

(65) Prior Publication Data

US 2005/0108605 A1 May 19, 2005

(51) Int. Cl.⁷ ............................................. G06F 17/50

(52) U.S. Cl. ..................... 703/14; 703/13; 703/15; 703/16; 703/17; 714/38; 714/39

(58) Field of Search ........................... 703/2, 13, 14; 714/38, 739; 716/5

(56) References Cited

U.S. PATENT DOCUMENTS

| | | | | |
|---|---|---|---|---|
| 5,202,889 A | * | 4/1993 | Aharon et al. | 714/739 |
| 5,500,941 A | * | 3/1996 | Gil | 714/38 |
| 5,592,674 A | * | 1/1997 | Gluska et al. | 710/269 |
| 5,855,011 A | * | 12/1998 | Tatsuoka | 706/45 |
| 6,163,876 A | * | 12/2000 | Ashar et al. | 716/5 |
| 6,381,715 B1 | * | 4/2002 | Bauman et al. | 714/718 |
| 6,792,438 B1 | * | 9/2004 | Wells et al. | 708/250 |

OTHER PUBLICATIONS

"Exploiting Hardware Sharing in High-Level Synthesis for Partial Scan Optimization", S. Dey et al, IEEE 1063-6757/93, IEEE 1993.*
"Random Pattern Testing Versus Deterministic Testing of RAM's", R. David et al, IEEE Transactions on Computer, vol. 38, No. 5, May 1989.*
"A Method for Testability Analysis and BIST Insertion at the RTL", Carletta et al, IEEE 1066-1409/95, IEEE 1995.*
"A Unified Approach for the Synthesis of Self-Testable Finite State Machine", B. Eschermann et al, 28th ACM/IEEE Design Automation Conference, ACM 1991.*
"Probabilist Modeling and Fault Analysis in Sequential Logic using Computer Simulation", Das et al, IEEE Transactions on Systems, vol. 20, No. 1, Mar./Apr. 1990.*

* cited by examiner

Primary Examiner—Jean R. Homere
Assistant Examiner—Fred Ferris
(74) Attorney, Agent, or Firm—Duke W. Yee; Casimer K. Salys; Cathrine K. Kinslow

(57) ABSTRACT

A driver module is provided that generates test patterns with desired tendencies. The driver module provides these test patterns to controlling code for simulation of a hardware model. The test patterns are generated by creating and connecting subgraphs in a Markov chain. The Markov model describes a plurality of states, each having a probability of going to at least one other state. Markov models may be created to determine whether to drive an interface in the hardware model and to determine the command to drive through the interface. Once the driver module creates and connects the subgraphs of the Markov models, the driver module initiates a random walk through the Markov chains and provides the commands to the controlling code.

9 Claims, 3 Drawing Sheets

PSEUDO RANDOM TEST PATTERN GENERATION USING MARKOV CHAINS

BACKGROUND OF THE INVENTION

1. Technical Field

The present invention relates to simulation and, in particular, to automatic generation of test patterns for simulation. Still more particularly, the present invention provides a method, apparatus, and program for automatically generating pseudo random test patterns using Markov chains.

2. Description of Related Art

In order to verify operation of a system through simulation, memory access test patterns must be generated. The patterns must be generated automatically, since the number of transactions driven by the patterns must be very large.

Random pattern generation is a typical approach for automatically generating test patterns. However, purely random patterns do not tend to produce transactions that test the limits of the system being simulated. Often, simulation is used to attempt to "break" the hardware being tested. Ideally, the designer would like to use the exact test patterns that will likely cause the hardware to fail. Thus, if the hardware withstands the stress of the test patterns, then the design is sound.

Examples of patterns that do tend to test the system limits are patterns having bursts and strides. But purely random pattern generation does not generally produce burst-like and stride-like patterns.

Therefore, it would be advantageous to automatically generate patterns that have desired tendencies.

SUMMARY OF THE INVENTION

The present invention provides a driver module that generates test patterns with desired tendencies. The driver module provides these test patterns to controlling code for simulation of a hardware model. The test patterns are generated by creating and connecting subgraphs in a Markov chain. Each subgraph may be specifically designed to induce a desired tendency in the test pattern, such as a burst or a stride. Many other tendencies may be designed into the test patterns using these subgraphs. The Markov model describes a plurality of states, each having a probability of going to at least one other state. Markov models may be created to determine whether to drive an interface in the hardware model and to determine the command to drive through the interface.

Once the driver module creates and connects the subgraphs of the Markov models, the driver module initiates a random walk through the Markov chains and provides the commands to the controlling code.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
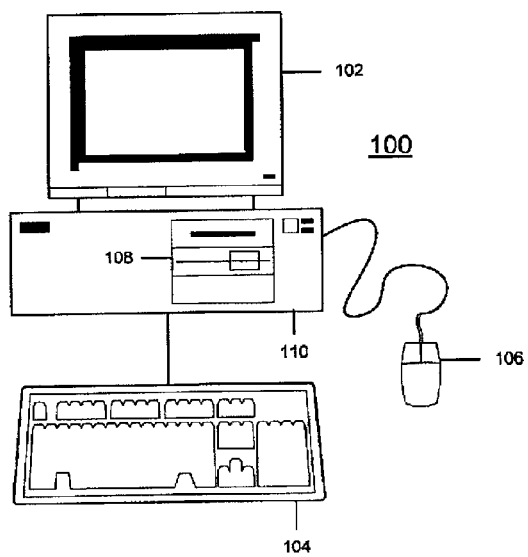
FIG. 1 is a pictorial representation of a data processing system in which the present invention may be implemented in accordance with a preferred embodiment of the present invention.

With reference now to the figures and in particular with reference to FIG. 1, a pictorial representation of a data processing system in which the present invention may be implemented is depicted in accordance with a preferred embodiment of the present invention. A computer 100 is depicted which includes a system unit 110, a video display terminal 102, a keyboard 104, storage devices 108, which may include floppy drives and other types of permanent and removable storage media, and mouse 106. Additional input devices may be included with personal computer 100, such as, for example, a joystick, touchpad, touch screen, trackball, microphone, and the like.

Computer 100 can be implemented using any suitable computer, such as an IBM RS/6000 computer or IntelliStation computer, which are products of International Business Machines Corporation, located in Armonk, N.Y. Although the depicted representation shows a computer, other embodiments of the present invention may be implemented in other types of data processing systems, such as a network computer. Computer 100 also preferably includes a graphical user interface that may be implemented by means of systems software residing in computer readable media in operation within computer 100.

Figure 2:
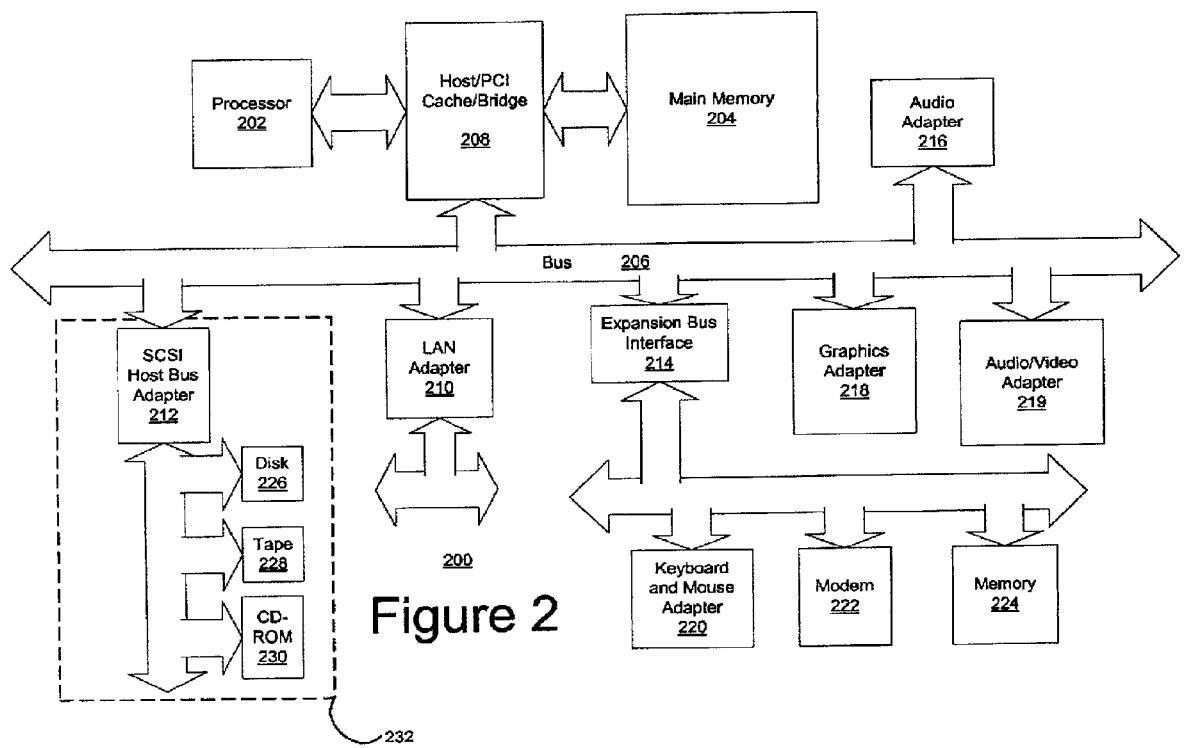
FIG. 2 is a block diagram of a data processing system in which the present invention may be implemented.

With reference now to FIG. 2, a block diagram of a data processing system is shown in which the present invention may be implemented. Data processing system 200 is an example of a computer, such as computer 100 in FIG. 1, in which code or instructions implementing the processes of the present invention may be located. Data processing system 200 employs a peripheral component interconnect (PCI) local bus architecture. Although the depicted example employs a PCI bus, other bus architectures such as Accelerated Graphics Port (AGP) and Industry Standard Architecture (ISA) may be used. Processor 202 and main memory 204 are connected to PCI local bus 206 through PCI bridge 208. PCI bridge 208 also may include an integrated memory controller and cache memory for processor 202.

Additional connections to PCI local bus 206 may be made through direct component interconnection or through add-in boards. In the depicted example, local area network (LAN) adapter 210, small computer system interface SCSI host bus adapter 212, and expansion bus interface 214 are connected to PCI local bus 206 by direct component connection. In contrast, audio adapter 216, graphics adapter 218, and audio/video adapter 219 are connected to PCI local bus 206 by add-in boards inserted into expansion slots. Expansion bus interface 214 provides a connection for a keyboard and mouse adapter 220, modem 222, and additional memory 224. SCSI host bus adapter 212 provides a connection for hard disk drive 226, tape drive 228, and CD-ROM drive 230. Typical PCI local bus implementations will support three or four PCI expansion slots or add-in connectors.

An operating system runs on processor 202 and is used to coordinate and provide control of various components within data processing system 200 in FIG. 2. The operating system may be a commercially available operating system such as Windows 2000, which is available from Microsoft Corporation. An object oriented programming system such as Java may run in conjunction with the operating system and provides calls to the operating system from Java programs or applications executing on data processing system 200. "Java" is a trademark of Sun Microsystems, Inc. Instructions for the operating system, the object-oriented programming system, and applications or programs are located on storage devices, such as hard disk drive 226, and may be loaded into main memory 204 for execution by processor 202.

Those of ordinary skill in the art will appreciate that the hardware in FIG. 2 may vary depending on the implementation. Other internal hardware or peripheral devices, such as flash ROM (or equivalent nonvolatile memory) or optical disk drives and the like, may be used in addition to or in place of the hardware depicted in FIG. 2. Also, the processes of the present invention may be applied to a multiprocessor data processing system.

For example, data processing system 200, if optionally configured as a network computer, may not include SCSI host bus adapter 212, hard disk drive 226, tape drive 228, and CD-ROM 230, as noted by dotted line 232 in FIG. 2 denoting optional inclusion. In that case, the computer, to be properly called a client computer, must include some type of network communication interface, such as LAN adapter 210, modem 222, or the like. As another example, data processing system 200 may be a stand-alone system configured to be bootable without relying on some type of network communication interface, whether or not data processing system 200 comprises some type of network communication interface. As a further example, data processing system 200 may be a personal digital assistant (PDA), which is configured with ROM and/or flash ROM to provide non-volatile memory for storing operating system files and/or user-generated data.

The depicted example in FIG. 2 and above-described examples are not meant to imply architectural limitations. For example, data processing system 200 also may be a notebook computer or hand held computer in addition to taking the form of a PDA. Data processing system 200 also may be a kiosk or a Web appliance. The processes of the present invention are performed by processor 202 using computer implemented instructions, which may be located in a memory such as, for example, main memory 204, memory 224, or in one or more peripheral devices 226–230.

Figure 3:
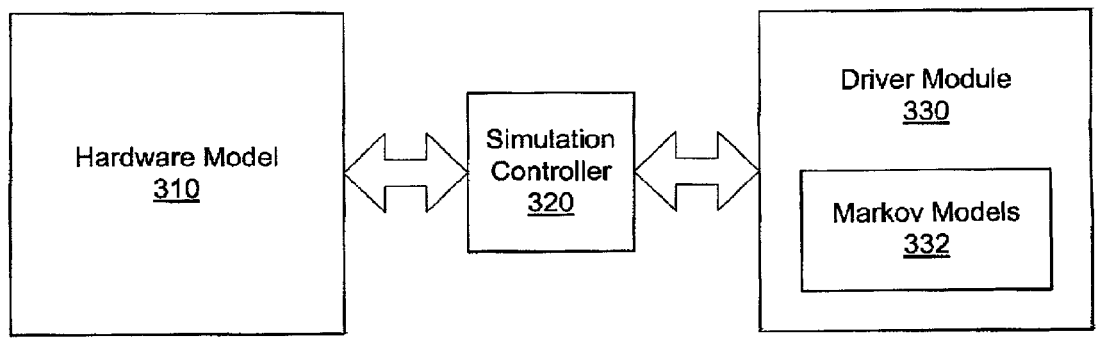
FIG. 3 is a block diagram of a simulation in accordance with a preferred embodiment of the present invention.

Turning flow to FIG. 3, a block diagram of a simulation is shown in accordance with a preferred embodiment of the present invention. A hardware model 310 is simulated tinder control of simulation controller 320. The simulation controller receives commands to send across the interfaces of hardware model 310 from driver module 330.

Hardware model 310, simulation controller 320, and driver module 330 may be embodied as code on a data processing system, such as data processing system 200 in FIG. 2. In an alternative embodiment, each one of the hardware model, simulation controller, and driver model module may be embodied on a separate data processing system. For example, hardware model 310 and simulation controller 320 may be embodied as code on one data processing system and receive commands to be driven on the interfaces of the hardware model from the driver module, which is embodied on another data processing system. As another example, simulation controller 320 and driver module 330 may be embodied on a data processing system, while the hardware model is embodied on specialized simulation hardware.

Driver module 330 creates and connects subgraphs of Markov models 332 that describe the tendencies of the test patterns for the hardware model. The Markov models describe a plurality of states, each having a probability of going to at least one other state. The probabilities of each Markov chain may be entered into a transition matrix indicating which state follows which other state.

Figure 4A:
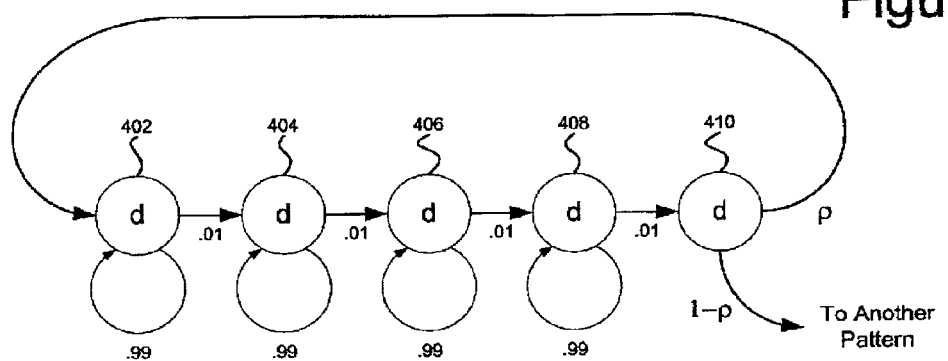
FIGS. 4A and 4B illustrate exemplary Markov chains used to drive interfaces of a hardware simulation model in accordance with a preferred embodiment of the present invention.
Figure 4B:
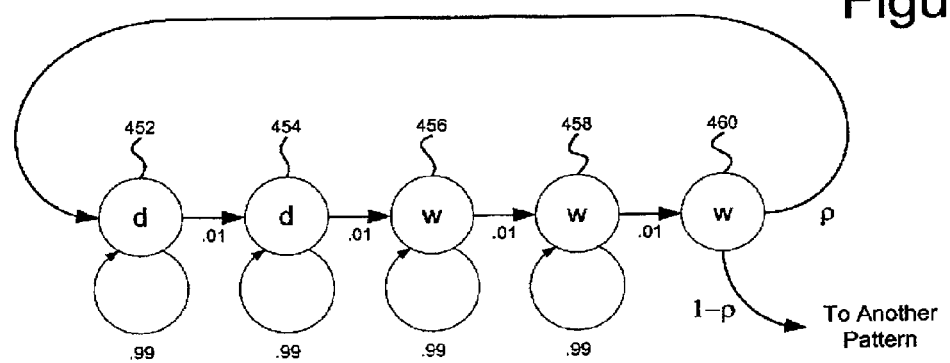

FIGS. 4A and 4B illustrate exemplary Markov chains used to drive interfaces of a hardware simulation model in accordance with a preferred embodiment of the present invention. Particularly, with reference to FIG. 4A, state 402 is a "drive" state, which dictates that the controlling code drive an interface of the hardware model. Thus, a subgraph may exist for each interface of the hardware model. State 402 has a probability of 0.01 or 1% of transitioning to state 404, which also is a drive state. State 402 also has a probability of 0.99 or 99% of returning to state 402. All the probabilities of outward transitions for a state must add up to one or 100%.

The Markov chain follows with state 404 having a 0.01 chance of transitioning to state 406 and a 0.99 probability of returning to step 404. Drive state 406 has a 0.01 probability of transitioning to state 408 and drive state 408, in turn, has a 0.01 chance of transitioning to state 410. Drive state 410 has a high probability, $\rho$, of returning to state 402 and a probability of 1-$\rho$ of transitioning to another pattern. The commands that are driven across the interface during a drive state may also be determined by a Markov chain. While in this chain, the test pattern will likely include a "burst" having at least five drive states and more likely having many more than five drive states. The tendencies of the burst may be modified by adjusting the probabilities and the minimum number of successive drive states. A Markov model used to describe whether to drive an interface may be referred to as a "driver model," while a Markov model used to describe the commands to send across the interface may be referred to as a "command model."

Turning now to FIG. 4B, state 452 is a "drive" state, which dictates that the simulation controller drive an interface of the hardware model. State 452 has a probability of 0.01 or 1% of transitioning to state 454, which also is a drive state. State 452 also has a probability of 0.99 or 99% of returning to state 452.

The Markov chain follows with state 454 having a 0.01 chance of transitioning to state 456 and a 0.99 probability of returning to step 454. State 456 is a wait state indicating that the interface is not to be driven while in this state. Wait state 456 has a 0.01 probability of transitioning to state 458 and wait state 458, in turn, has a 0.01 chance of transitioning to state 460. Wait state 460 has a high probability, $\rho$, of returning to state 452 and a probability of 1-$\rho$ of transitioning to another pattern. This Markov chain will likely result in a "stride" having at least two drive states followed by at least three wait states, although due to the probabilities each stride will more likely have many drive and wait states. Many other tendencies may be designed into the test patterns using these subgraphs and combinations of subgraphs.

Figure 5:
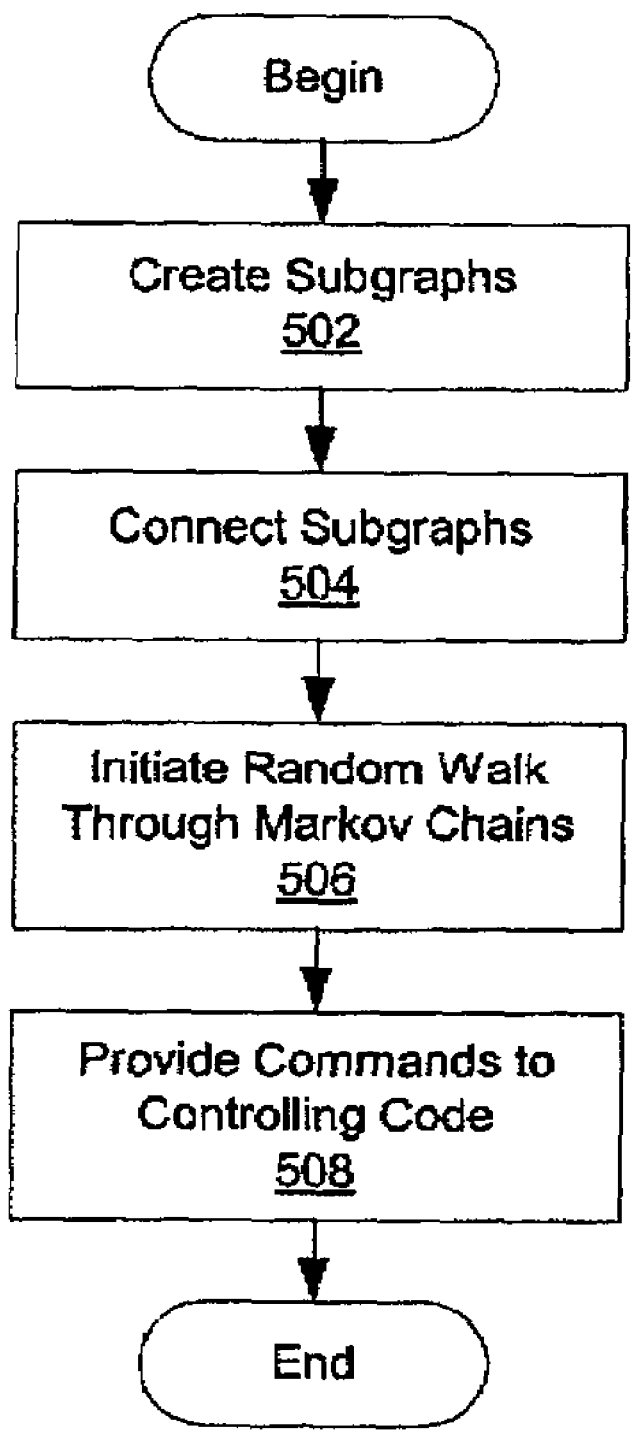
FIG. 5 is a flowchart illustrating the operation of a pseudo random test pattern generation process in accordance with a preferred embodiment of the present invention.

With reference now to FIG. 5, a flowchart is shown illustrating the operation of a pseudo random test pattern generation process in accordance with a preferred embodiment of the present invention. The process begins and creates subgraphs that describe the behaviors desired in the test patterns (step 502). Next, the process connects the subgraphs (step 504) and initiates a random walk through the Markov chains (step 506). Thereafter, the process provides the commands generated by the Markov chains to the controlling code (step 508) and ends.

Thus, the present invention solves the disadvantages of the prior art by providing a driver module that generates test patterns based on Markov chains. The Markov chains may be designed to generate test patterns with desired tendencies. The driver module provides these test patterns to controlling code for simulation of a hardware model. The test patterns are generated by creating and connecting subgraphs in the Markov chains. The Markov model describes a plurality of states, each having a probability of going to at least one other state. Markov models may be created to determine whether to drive an interface in the hardware model and other Markov models may be created to determine the commands to drive through the interface.

Once the driver module creates and connects the subgraphs of the Markov models, the driver module initiates a random walk through the Markov chains and provides the commands to the controlling code.

It is important to note that while the present invention has been described in the context of a fully functioning data processing system, those of ordinary skill in the art will appreciate that the processes of the present invention are capable of being distributed in the form of a computer readable medium of instructions and a variety of forms and that the present invention applies equally regardless of the particular type of signal bearing media actually used to carry out the distribution. Examples of computer readable media include storage type media such a floppy disc, a hard disk drive, a RAM, and CD-ROMs and transmission-type media such as digital and analog communications links.

The description of the present invention has been presented for purposes of illustration and description, but is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method for generating pseudo random test patterns for simulating a hardware model comprising:
    generating a driver model having a plurality of states, wherein each state indicates whether to drive an interface of the hardware model;
    initiating a random walk through the driver model to generate a driver test pattern;
    controlling simulation of the hardware model using the driver test pattern;
    generating a command model having a plurality of states, wherein each state indicates a command to send across an interface of the hardware model;
    initiating a random walk through the command model to generate a command test pattern; and
    controlling simulation of the hardware model using the command test pattern.

2. The method of claim 1, wherein the step of generating a command model comprises:
    creating at least one command subgraph having a plurality of command states; and
    connecting the at least one command subgraph to form the command model.

3. The method of claim 2, wherein each command subgraph comprise a Markov chain.

4. The method of claim 2, wherein each state has a probability of transitioning to at least one other state.

5. An apparatus for generating pseudo random test patterns for simulating a hardware model comprising:
    generation means for generating a driver model having a plurality of states, wherein each state indicates whether to drive an interface of the hardware model;
    initiation means for initiating a random walk through the driver model to generate a driver test pattern;
    control means for controlling simulation of the hardware model using the driver test pattern;
    means for generating a command model having a plurality of states, wherein each state indicates a command to send across an interface of the hardware model;
    means for initiating a random walk through the command model to generate a command test pattern; and
    means for controlling simulation of the hardware model using the command test pattern.

6. The apparatus of claim 5, wherein the means for generating a command model comprises:
    means for creating at least one command subgraph having a plurality of command states; and
    means for connecting the at least one command subgraph to using the command model.

7. The apparatus of claim 6, wherein each command subgraph comprises a Markov chain.

8. The apparatus of claim 6, wherein each state has a probability or transitioning to at least one other state.

9. A computer program product, in a computer readable storage medium, for generating pseudo random test patterns for simulating a hardware model comprising:
    instructions for generating a driver model having a plurality of states, wherein each state indicates whether to drive an interface of the hardware model;
    instructions for initiating a random walk through the driver model to generate a driver test pattern;
    instructions for controlling simulation of the hardware model using the driver test pattern;
    instructions for generating a command model having a plurality of states, wherein each state indicates a command to send across an interface of the hardware model;
    instructions for initiating a random walk through the command model to generate a command test pattern; and
    instructions for controlling simulation of the hardware model using the command test pattern.

* * * * *

UNITED STATES PATENT AND TRADEMARK OFFICE
CERTIFICATE OF CORRECTION

PATENT NO.    : 6,965,852 B2  
DATED         : November 15, 2005  
INVENTOR(S)   : Stuecheli It is certified that error appears in the above-identified patent and that said Letters Patent is hereby corrected as shown below:

<u>Column 3,</u>  
Line 51, after "Turning" delete "flow" and insert -- now --.  
Line 61, after "driver" delete "model".

<u>Column 6,</u>  
Line 32, after "to" delete "using" and insert -- form --.  
Line 36, after "probability" delete "or" and insert -- of --.

Signed and Sealed this

Sixth Day of June, 2006

JON W. DUDAS  
*Director of the United States Patent and Trademark Office*